United States Patent [19]

Holm et al.

[11] Patent Number: 5,221,633
[45] Date of Patent: Jun. 22, 1993

[54] METHOD OF MANUFACTURING A DISTRIBUTED DRIVE OPTOELECTRONIC INTEGRATED CIRCUIT

[75] Inventors: Paige M. Holm, Phoenix; George W. Rhyne, Mesa, both of Ariz.

[73] Assignee: Motorola, Inc., Schaumburg, Ill.

[21] Appl. No.: 756,734

[22] Filed: Sep. 9, 1991

[51] Int. Cl.⁵ ............................................. H01L 21/70
[52] U.S. Cl. ........................................ 437/51; 437/54; 437/912; 148/DIG. 72
[58] Field of Search ............... 437/51, 54, 5, 126, 437/127, 912, 128; 148/DIG. 72; 357/16, 17; 372/45

[56] References Cited

U.S. PATENT DOCUMENTS

| | | | |
|---|---|---|---|
| 4,514,896 | 5/1985 | Dixon et al. | 437/127 |
| 4,534,033 | 8/1985 | Nishizawa et al. | 357/17 |
| 4,607,368 | 8/1986 | Hori | 357/17 |
| 4,956,682 | 9/1990 | Ohnaka et al. | 357/16 |
| 4,995,049 | 2/1991 | Kahen et al. | 357/17 |
| 5,014,096 | 5/1991 | Matsuda et al. | 357/17 |
| 5,014,823 | 4/1992 | Mand | 437/54 |
| 5,135,877 | 8/1992 | Albergo et al. | 437/127 |

FOREIGN PATENT DOCUMENTS 62-01268 1/1987 Japan .................. 437/126

Primary Examiner—Brian E. Hearn
Assistant Examiner—Michael Trinh
Attorney, Agent, or Firm—Joe E. Barbee

[57] ABSTRACT

A method of manufacturing a transmitter optoelectronic integrated circuit (10) which comprises a double heterostructure optical emission device (11) and drive circuitry (16). The optical emission device (11) comprises a plurality of optical emission loci (21) distributed throughout an active layer (12) of the optical emission device (11). Drive circuit (16) comprises a plurality of first portions (17) and a second portion (18) wherein the plurality of first portions (17) are above the plurality of emission loci (21). Second portion (18) is integrated in a lateral orientation with respect to the plurality of first portions (17). The chemical composition of the plurality of first portions (17) are such that they are nonabsorbing to optical emissions from the optical emission device (11).

14 Claims, 2 Drawing Sheets

METHOD OF MANUFACTURING A DISTRIBUTED DRIVE OPTOELECTRONIC INTEGRATED CIRCUIT

BACKGROUND OF THE INVENTION

This invention relates, in general, to transmitter optoelectronic integrated circuits, and more particularly to a distributed drive, vertically integrated, transmitter optoelectronic integrated circuit for mating with a plastic optical fiber.

Optoelectronic transmission systems have emerged as a prominent technology in a variety of disciplines including: automotive, computer, medical, and communications. Typically, an optoelectronic system comprises a transmitting optoelectronic integrated circuit, or transmission source, coupled to a receiving integrated circuit via an optical fiber. Two key indices of an optoelectronic signal transmission system are the coupling efficiency between the transmission source and the fiber optic cable, and the power level of the signal generated by the transmission source.

Coupling efficiency is a figure of merit that indicates how much of the optical signal generated by the transmission source is conducted by the optical fiber. The theoretical maximum coupling efficiency is a function of the dimensions of both the optical fiber and the transmission source as shown by Hudson in his paper "Calculation of the Maximum Optical Coupling Efficiency into Multimode Optical Waveguides" (Applied Optics Vol. 13, No. 5, May 1974). In particular, the maximum coupling efficiency is determined by the diameter and numerical aperture of the optical fiber as well as the diameter of the emission source. Hence, the optical fiber is an important component in the optoelectronic transmission system.

Generally, optical fibers are cylindrically shaped with an inner core surrounded by an outer core, commonly referred to as a cladding layer. Two optical fiber parameters which strongly influence maximum coupling efficiency are the inner core diameter and the numerical aperture. In the past, the preferred material for the optical fiber has been glass; a material in which both the inner core diameter and numerical aperture are relatively small. Further, the use of glass optical fibers requires that the transmitting and receiving portions of these systems employ expensive packaging materials to ensure adequate coupling between these two components.

According to the mathematical relationship derived by Hudson, selecting an inner core diameter and a numerical aperture of the optical fiber constrains the diameter of the transmission source for a selected maximum coupling efficiency. Further, to obtain an acceptable maximum coupling efficiency, the relationship between the inner core diameter and the numerical aperture of the optical fiber limits the transmission source diameter to be a small percentage of the inner core diameter. As an example, for a typical glass fiber with an inner core diameter of 50 micrometers and an numerical aperture of 0.21, the transmission source diameter is limited to 20 percent of the optical fiber inner core diameter for the theoretical maximum coupling efficiency.

The primary disadvantage of a small transmission source diameter is that the injection current density in the transmitting device must be relatively high to achieve an acceptable minimum coupled power from the transmitting optoelectronic integrated circuit to the optical fiber. Moreover, thermal properties of both transmitter optoelectronic semiconductor devices, and the lower cost plastic packages used for encapsulating the devices, limit the maximum injection current. Hence, theoretical maximum coupled power has been constrained by physical limitations of the transmitting semiconductor device in addition to those posed by the optical fiber cable.

Further, the use of glass optical fibers has limited the topography of the circuitry associated with transmitter optoelectronic integrated circuits such that current must be collected at contact regions of a transmission source transistor, and transported through metal interconnects. Ultimately, the current must be redistributed by an optimized ohmic contact pattern on an optical emission device. Associated with this current distribution scheme are parasitic resistances and capacitances that degrade the performance of the transmitter optoelectronic integrated circuit. And as discussed previously, the use of glass optical fibers requires very sophisticated and expensive optoelectronic circuit packaging material to achieve the theoretical maximum coupling efficiency.

More recently plastic optical fibers have gained widespread acceptance as an alternative to glass optical fibers. Plastic optical fibers have both a larger inner core diameter and numerical aperture than do their glass counterparts. Hence, for a similar maximum coupling efficiency, the transmission source diameter for a plastic optical fiber may be greater than that of a glass optical fiber. As an example, to achieve the theoretical maximum coupling efficiency, a typical plastic optical fiber with an inner core diameter of 1000 micrometers and a numerical aperture of 0.47 the transmission source diameter can be up to 50 percent of the diameter of the plastic optical fiber. Hence, one advantage derived by using plastic optical fibers is that the larger allowable transmission source diameter provides the option for a lower injection current density. Further, plastic optical fibers make the use of lower cost plastic packaging for the transmission optoelectronic devices feasible. Unfortunately, the present methods for fabricating the transmission optoelectronic devices still renders the use of high current densities in localized portions of the optoelectronic devices. Further, the parasitic resistances and capacitances associated with current collection, transport, and redistribution in the optoelectronic devices still exist.

Accordingly, it would be beneficial to have a transmitter optoelectronic integrated circuit capable of achieving high output current levels with relatively low current densities; while simultaneously taking advantage of the increased transmission source area afforded by using plastic optical fibers to optimize the optoelectronic integrated circuit layout wherein the circuit does not suffer from the performance degradations caused by parasitic resistances and capacitances associated with current collection, transport, and redistribution.

SUMMARY OF THE INVENTION

Briefly stated, the present invention is a method of manufacturing a distributed drive vertically integrated optoelectronic integrated circuit which comprises a double heterostructure optical emitter with associated drive circuitry. Further, the optical emitter and a first portion of the drive circuitry are configured in a vertical orientation wherein the drive circuitry is above the optical emitter. A second portion of the drive circuitry is configured in a lateral orientation relative to the first portion. The transmitter optoelectronic integrated circuit is capable of being mated with an optical fiber.

DETAILED DESCRIPTION OF THE DRAWINGS

Figure 1:
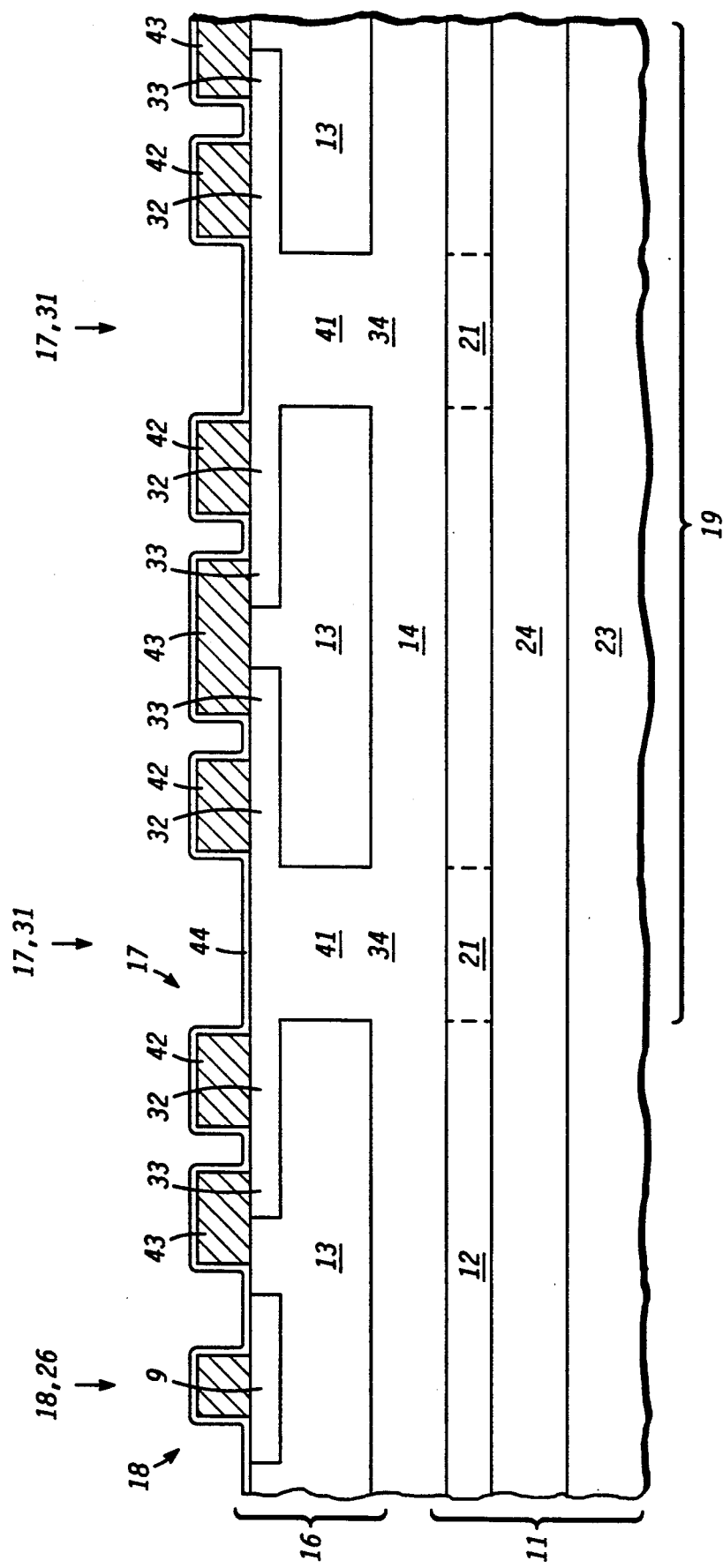
FIG. 1 is a cross-sectional side view of an embodiment of the present invention.

FIG. 1 illustrates a cross-sectional side view of a portion of an embodiment of the present invention wherein the invention comprises a plurality of drive devices 16 fabricated above a double heterostructure optical emission device 11. FIG. 1 shows a substrate 23 having a series of semiconductor layers disposed thereon. In this embodiment, substrate 23 comprises gallium arsenide having a P+ conductivity type; although substrates of other well known materials may be employed. Also in this embodiment, semiconductor layers of optical emission device 11 comprise: a second confinement layer 24, an active layer 12, and a first confinement layer 14. Further, the preferred semiconductor materials for the layers of this embodiment are aluminum gallium arsenide having a P conductivity type for both second confinement layer 24 and active layer 12, and aluminum gallium arsenide having N conductivity type for first confinement layer 14. In addition, a mole fraction of aluminum for active layer 12 is lower than the mole fraction of aluminum for both first confinement layer 14 and second confinement layer 24. The double heterostructure characteristic of optical emission device 11 arises because of the aluminum mole fractions of the different semiconductor layers. It will be understood that FIG. 1 is drawn to illustrate the features of the present invention, and therefore is not drawn to scale.

The semiconductor layers of this embodiment form a conventional double heterostructure light emitting diode, commonly referred to as an LED, wherein the layers are formed by methods well known to those skilled in the art. It will be understood that the semiconductor materials described in the embodiment of double heterostructure optical emitter 11 are given as examples only and not as a limitation to the present invention. In other words, the semiconductor material of double heterostructure optical emitter 11 layer structures is not limited by the examples given.

A drive circuit 16, comprising a first portion 17 and a second portion 18, is fabricated on first confinement layer 14, wherein first portion 17 comprises a plurality of optically nonabsorbing drive devices and second portion 18 comprises a peripheral drive network. In a field effect transistor embodiment, the plurality of drive devices 17 comprise a plurality of field effect transistors 31, commonly referred to as FET's 31. The purpose of the plurality of FET's 31 is to modulate current wherein the current is channelled towards an optical emission area 19. The cross-sectional side view of FIG. 1 is an embodiment wherein first portion 17 of drive circuit 16 is FET 31.

Typically, the FET 31 has a gate region 32, a source region 33, and a drain region 34. To form these regions a buried layer 13 is grown over first confinement layer 14. A plurality of troughs are formed at a top surface of buried layer 13 by implanting portions of buried layer 13 with a suitable impurity material. Portions of the troughs comprise gate regions 32 and source regions 33. A plurality of vertical channels 41 are formed by further implanting portions of the troughs with an impurity material. Those portions of the troughs comprising gate regions 32 and source regions 33 are not implanted during the formation of vertical channels 41. In this embodiment, the impurity material has N type conductivity. Further, the implant forming vertical channels 41 extends from a top surface of the troughs through buried layer 13 into first confinement layer 14. Hence in this embodiment, the portions of the troughs receiving the implant forming vertical channels 41 have an N+ conductivity type.

Drain regions 34 comprise vertical channels 41 and portions of first confinement layer 14. Thus drain regions 34 are vertically oriented whereas gate regions 32 and source regions 33 are laterally oriented. First confinement layer 14 is common to double heterostructure optical emitter 11 and drive circuit 16. In other words, first confinement layer 14 serves as a confinement layer for optical emitter 11 as well as a portion of the drain 34 of the plurality of FET's 31.

Further, in this embodiment, buried layer 13 comprises aluminum gallium arsenide having a P conductivity type, wherein the aluminum mole fraction of buried layer 13 is greater than the aluminum mole fraction of active layer 12. It will be understood that in the embodiments presented, the mole fractions of aluminum for all aluminum gallium arsenide layers above active layer 12 are larger than the mole fraction of aluminum for active layer 12; hence, the layers above active layer 12 are nonabsorbing to emissions from active layer 12. It will be further understood that the method for fabricating FET's 31 is not a limitation to the present invention. In other words, the layers of FET's 31 may be formed by other means; as, for example, by selectively implanting first confinement layer 14 with an appropriate impurity material to form buried layer 13 and vertical channels 41.

The plurality of vertical channels 41 and a plurality of portions of buried layer 13 cooperate to define a plurality of optical emission loci 21 within optical emission device 11. Electrons injected into source regions 33 of FET,s 31 are directed through vertical channels 41 toward optical emission loci 21. The energy bandgaps of the junctions formed by buried layer 13 and vertical channels 41 prevent electrons from flowing into buried layer 13, thus electrons flow in a vertical direction through vertical channels 41. What is more, the energy bandgaps of the junctions formed by buried layer 13 and first confinement layer 14 prevent electrons from flowing laterally in the first confinement region 14. Hence, electrons are directed vertically through first confinement region 14 into active region 12. As is obvious to those skilled in the art, regions of active layer 12 into which electrons flow emit photons, commonly referred to as light. Since electron flow is confined to a plurality of areas, or optical emission loci 21, distributed throughout active area 12, only this plurality of areas will emit light. Further, optical emission loci 21 correspond to portions of active area 12 which are below vertical channels 41. Hence the portions of active layer 12 that emit light form a plurality of optical emission loci 21 or emission centers 21, wherein the plurality of distributed optical emission loci 21 are collectively referred to as an optical emission area 19.

Peripheral drive network 18 is formed laterally and in conjunction with portions of drive devices 17. Lateral placement of peripheral drive network 18 permits planar processing for drive devices 17. In one embodiment, peripheral drive network 18 comprises a P-N junction diode 26, wherein a region 13 having P conductivity type or commonly referred to as an anode of diode 26 is formed from a portion of buried layer 13; region 9 of diode 26 having N conductivity type is formed by implanting portions of region 13 with an impurity material having N conductivity type. A portion of region 13 is connected to a plurality of field effect transistor source regions 33. Available fabrication techniques allow implant of diode regions and trough regions simultaneously. It will be understood that the embodiment for peripheral drive circuit 18 is presented as an example only and not as a limitation to the present invention. In other words, the type and number of peripheral drive circuits 18 are not limited by the example given.

A plurality of gate and source electrodes 42 and 43, respectively, are formed by depositing a conductive material over gate 32 and source 33 portions of drive devices 17. In one embodiment, the conductive material for source electrode 43 is deposited over the portions of the troughs distal to vertical channels 41 wherein the deposition extends over portions of buried layer 13. Also in this embodiment, the conductive material for gate electrode 42 is deposited above portions of the troughs adjacent to source electrodes 43. It will be understood that gate and source electrodes, 42 and 43 respectively, are above portions of the trough under which portions of buried layer 13 are present. As is obvious to those skilled in the art it is preferred to have gate and source electrodes, 42 and 43 respectively, above portions of the trough wherein the portions of the trough are not above vertical channel 41; thereby minimizing blockage of emitted light by the gate and source electrodes 42 and 43. Contact electrodes for peripheral drive network 18 are also deposited. Further, in a preferred embodiment the conductive material for gate electrode 42 comprises titanium, platinum and gold. Also in this embodiment, the conductive material for source electrodes 43 and contact electrodes for peripheral drive network 18 comprises nickel, germanium and gold. Finally, a passivating layer 44 is coated over the surface of transmitter optoelectronic integrated circuit 10. Passivating layer 44 also serves as an antireflective coating. In a preferred embodiment, passivating layer 44 is nitride.

Figure 2:
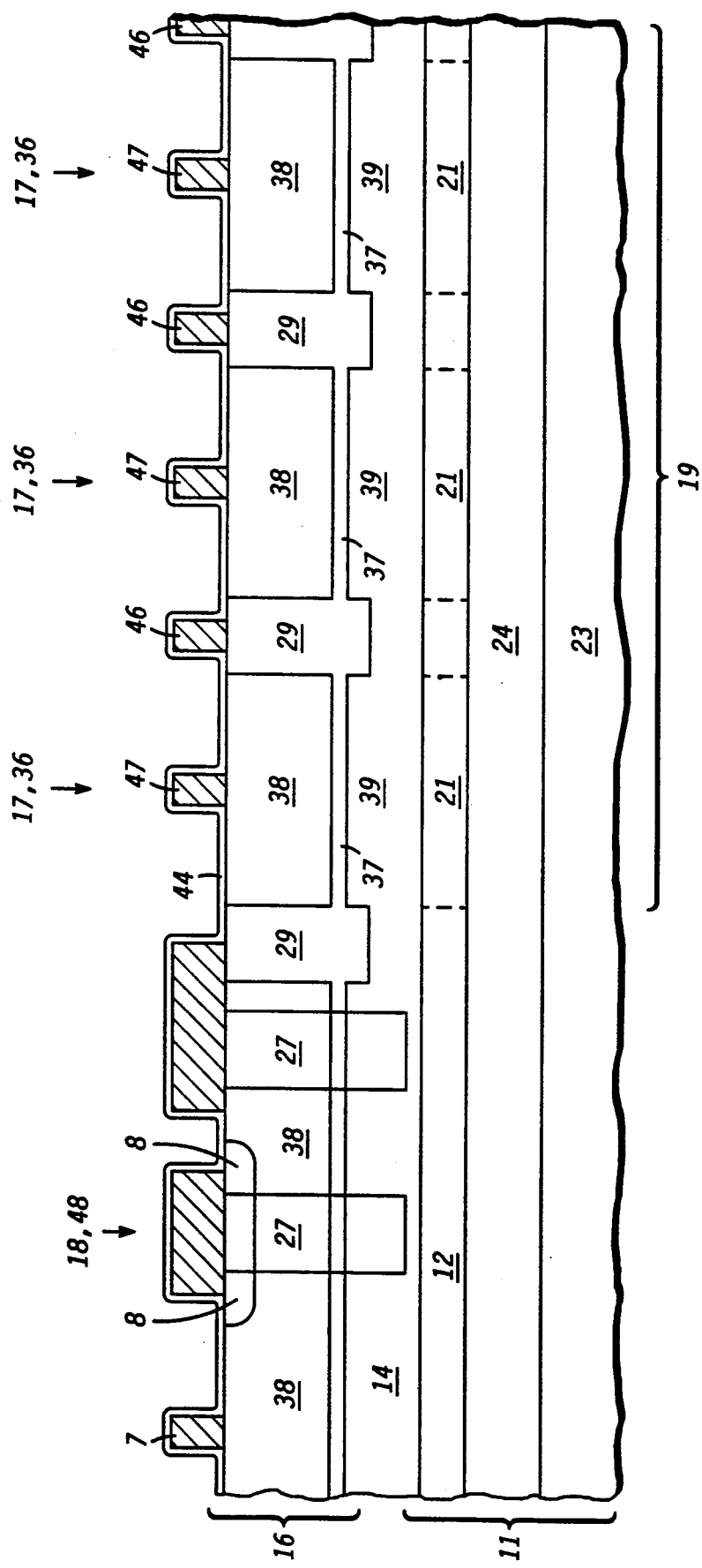
FIG. 2 is a cross-sectional side view of an alternate embodiment of the present invention.

In a bipolar junction transistor embodiment for drive circuit 16 the plurality of drive devices 17 comprise a plurality of bipolar junction transistors 36. As in the FET embodiment, the purpose of the first portion 17 of drive circuit 16 is to regulate current, wherein the current is channelled towards optical emission area 19. FIG. 2 illustrates a cross-sectional side view of a portion of an embodiment wherein the plurality of drive devices 17 are heterojunction bipolar transistors 36. Again, it will be understood that FIG. 2 is drawn to illustrate the features of the invention and therefore is not drawn to scale.

Typically, a bipolar junction transistor has a base layer 37, an emitter layer 38, and a collector layer 39. In this embodiment, collector layer 39 comprises portions of first confinement layer 14. In other words, optical emitter 11 and drive circuit 16 share first confinement layer 14. To further elucidate on this embodiment, first confinement layer 14 serves as a confinement layer for optical emitter 11 as well as the collector layer 39 of the plurality of bipolar junction transistors 36.

A layer of semiconductor material is grown over first confinement layer 14 thereby forming base layer 37, wherein base layer 37 comprises aluminum gallium arsenide having a P conductivity type and an aluminum mole fraction greater than the aluminum mole fraction of active layer 12. An emitter layer 38 comprising aluminum gallium arsenide having an N conductivity type is grown over base layer 37. The aluminum mole fraction of emitted layer 38 is greater than or equal to the aluminum mole fraction of base layer 37 thereby forming a heterojunction bipolar transistor. Again, it will be understood that in the embodiments presented, the mole fractions of aluminum for all aluminum gallium arsenide layers above active layer 12 are larger than the mole fraction of aluminum for active layer 12; hence the layers above active layer 12 are transparent to emissions from active layer 12.

Further, a plurality of implant regions 29 are formed wherein an impurity material is implanted into portions of heterojunction bipolar transistor structure 36. The implant extends from the surface of emitter layer 38, through base layer 37 and into first confinement layer 14. In this embodiment, the impurity material is Beryllium having a P conductivity type. What is more, the energy bandgaps of the plurality of junctions formed between implant regions 29 and first confinement layer 14 are wide, thereby preventing lateral current flow into first confinement layer 14. Further, the wide bandgap junction formed by implant regions 29 prevents current from flowing into active layer 12 below implant regions 29; rather, implant regions 29 direct current to flow into portions of active layer 12 distributed throughout optical emission device 11. Hence, electrons are injected through the plurality of vertically oriented transistors, comprising the emitter layer 38, the base layer 37, and the collector layer 39, through first confinement layer 14 and into active layer 12.

As discussed in the FET embodiment, the electrons entering active layer 12 stimulate the emission of photons. Photons are only emitted from those portions of active layer 12 into which electrons are injected, commonly referred to as optical emission loci 21; it should be understood that entire active layer 12 is capable of emitting photons. The plurality of implant regions 29 are distributed above optical emitter 11, and direct electron flow into a optical emission loci 21. Hence, the plurality of optical emission loci 21 are distributed throughout the optical emitter 11 and form optical emission area 19.

Peripheral drive circuit 18 is formed laterally and in conjunction with portions of drive device 17. Lateral placement of peripheral drive circuit 18 permits planar processing for heterojunction bipolar transistor 36. In one embodiment, peripheral drive circuit 18 is formed in conjunction with portions of drive device 17 and comprises a two diode network 48 wherein the diodes are P-N junction diodes. A diode structure is formed from a portion of emitter layer 38, which is a region of N conductivity type, and a region of P conductivity type 8; wherein the structure is separated into two diode network 48 by an isolation implant region 27. Further the regions of P conductivity type are shorted together. Electrical contact to the two diode network 48 is accomplished via contact electrode 7. Further, two diode network 48 is separated from drive device 17 by isolation implant region 27.

In an alternate embodiment, peripheral drive circuit 18 comprises an NPN transistor network wherein an isolation implant region separates the NPN transistor network from semiconductor driving device 17. In a preferred embodiment, the impurity material for the isolation implants is oxygen, although other well known materials may be employed. It will be understood that the peripheral drive circuit 18 embodiments are presented as examples only and not as limitations to the present invention. In other words, the type and number of peripheral drive circuits 18 is not limited by the examples shown.

A plurality of emitter contacts 47, commonly referred to as emitter fingers, are deposited over portions of emitter layer 38. In an embodiment, the metallization scheme for emitter fingers 47 comprises nickel, germanium, and gold. It will be understood that emitter fingers 47 are narrow to limit the screening of emitted photons. Further, in a preferred embodiment, heterojunction bipolar transistor 36 is optimized for coupling to a plastic optical fiber (not shown), and thus the wavelength of the emitted photons is approximately 660 nanometers. Also in this embodiment, the active layer has an aluminum mole fraction of approximately 0.35, which may require that base layer 37, emitter layer 38, and collector layer 39 of heterojunction bipolar transistor 36 have indirect bandgaps to eliminate absorption of photons in heterojunction bipolar transistor 36.

A plurality of base contacts 46, commonly referred as base fingers, are deposited on portions of the surface over implant regions 29. In a preferred embodiment, the metallization scheme for base fingers 46 comprises titanium, platinum, and gold. A passivating layer 44 is coated over the surface of transmitter optoelectronic integrated circuit 10. Again, passivating layer 44 also serves as an antireflective coating. In a preferred embodiment, passivating layer 44 is nitride.

By now it should be appreciated that there has been provided an improved method for integrating a double heterostructure optical emission device with drive circuitry for coupling with a fiber optic cable. A plurality of optical emission loci are distributed throughout the optical emission device, rather than having a single optical emission locus, as is the present state of the technology. Hence the current density associated with each of the plurality of optical emission loci may be lower than that of the single optical emission locus implementation; yet the overall current levels generated by the optical emission device are the same. In addition, the reduction in the current density in the active area, arising from having distributed emission areas, results in an improvement in device reliability. Moreover, a more uniform current distribution is possible. Although this invention may be coupled with either glass or plastic fiber optic cables, the latter offer the additional benefit of an increased emission source diameter; thereby permitting a further increase the number of distributed emission loci.

In addition, vertical integration of the devices, as employed in this invention, eliminates the need for elaborate metallization schemes, and thereby reduces the resistive and capacitive parasitics inherent in metallization structures. Finally, this distributed drive vertical integration scheme allows for the implementation of planar fabrication techniques.

We claim:
1. A method of integrating an optical emitter and a drive circuit in a semiconductor material to form a distributed drive vertically integrated optoelectronic integrated circuit capable of being mated with an optical fiber which comprises:
    providing a double heterostructure optical emitter having an active layer;
    providing a first confinement layer on the active layer;
    fabricating a drive circuit on the first confinement layer, the drive circuit comprising a first portion and a second portion wherein the first portion comprises a plurality of optically nonabsorbing drive devices having a vertically oriented region and the second portion comprises a peripheral drive network;
    defining a plurality of emission loci within an optical emission area of the double heterostructure optical emitter
    providing the first portion with a bandgap larger than the bandgap of the double heterostructure optical emitter wherein the first portion is nonabsorbing to optical emissions.

2. The method for integrating the optical emitter and drive circuit of claim 1 further including fabricating the first portion of the drive circuit as at least one field effect transistor, wherein the at least one field effect transistor comprises a gate region, a source region, and a drain region.

3. The method for integrating the optical emitter and drive circuit of claim 1 wherein the step of defining a plurality of emission loci includes providing at least one vertical channel which cooperates with a portion of a buried layer.

4. The method for integrating the optical emitter and drive circuit of claim 3 further including fabricating the gate and source regions over the buried layer wherein the buried layer serves to confine current injection into the emission loci.

5. The method for integrating the optical emitter and drive circuit of claim 1 further including fabricating the first portion of the drive circuit as a heterojunction bipolar transistor having a plurality of base and emitter fingers.

6. The method for integrating the optical emitter and drive circuitry of claim 5 further including implanting regions above the optical emission area to form a wide bandgap junction which laterally confines current injection into the emission loci.

7. A method of manufacturing a distributed drive vertically integrated transmitter optoelectronic integrated circuit, comprising the steps of:
    manufacturing a double heterostructure optical emission device having a first confinement layer;
    fabricating a plurality of drive devices on a top portion of the optical emission evice, the plurality of drive devices distributed throughout an emission area of the optical emission device, wherein the plurality of drive devices cooperate with the double heterostructure optical emission device to form a plurality of optical emission loci;
    forming peripheral drive circuitry on a portion of the optical emission device laterally spaced from the plurality of drive devices; and
    coating portions of the plurality of drive devices and peripheral drive circuitry with an antireflective material.

8. The method of manufacturing the optoelectronic integrated circuit of claim 7 further including fabricating the plurality of drive devices as field effect transistors having a buried layer over the first confinement layer.

9. The method of manufacturing the optoelectronic integrated circuit of claim 8 further including implanting at least one portion of the buried layer to form a vertical channel wherein an energy bandgap of a junction formed by the buried layer and the vertical channel constrains current to flow through the vertical channel into at least one of the plurality of optical emission loci rather than in a lateral direction.

10. The method of manufacturing the optoelectronic integrated circuit of claim 7 further including fabricating the plurality of drive devices as heterojunction bipolar transistors wherein the heterojunction bipolar transistors comprise a collector layer, a base layer, and an emitter layer.

11. The method of manufacturing the optoelectronic integrated circuit of claim 10 further including forming the collector layer of the heterojunction bipolar transistors from the first confinement layer of the optical emission device.

12. The method of manufacturing the optoelectronic integrated circuit of claim 10 further including fabricating the plurality of drive devices as vertically oriented transistors such that the plurality of optical emission loci are directly below the plurality of drive devices.

13. The method of manufacturing the optoelectronic integrated circuit of claim 10 further including implanting portions of the collector layer, the base layer, and the emitter layer wherein the implant forms a junction between the implanted portions and the first confinement layer, the junction having a wide energy bandgap which serves to laterally confine current flow.

14. The method of manufacturing the optoelectronic integrated circuit of claim 7 further including fabricating the peripheral drive circuitry in a lateral orientation relative to the optical emission device.

* * * * *